United States Patent
Wu et al.

(10) Patent No.: US 6,767,791 B1
(45) Date of Patent: Jul. 27, 2004

(54) STRUCTURE AND METHOD FOR SUPPRESSING OXIDE ENCROACHMENT IN A FLOATING GATE MEMORY CELL

(75) Inventors: Yider Wu, Campbell, CA (US); Harpreet K. Sachar, Sunnyvale, CA (US); Jean Yee-Mei Yang, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/364,569

(22) Filed: Feb. 10, 2003

(51) Int. Cl.⁷ .......................................... H01L 21/336
(52) U.S. Cl. ...................................... 438/257
(58) Field of Search ........................................ 438/257

(56) References Cited

U.S. PATENT DOCUMENTS

| | | | | |
|---|---|---|---|---|
| 6,001,713 A | * | 12/1999 | Ramsbey et al. | 438/520 |
| 6,127,227 A | * | 10/2000 | Lin et al. | 438/261 |
| 6,362,045 B1 | * | 3/2002 | Lin et al. | 438/257 |
| 6,479,351 B1 | * | 11/2002 | Lojek et al. | 438/266 |
| 6,583,466 B2 | * | 6/2003 | Lin et al. | 257/314 |
| 6,630,392 B2 | * | 10/2003 | Kim et al. | 438/586 |

* cited by examiner

Primary Examiner—David Nelms
Assistant Examiner—Thao P. Le
(74) Attorney, Agent, or Firm—Farjami & Farjami LLP

(57) ABSTRACT

According to one exemplary embodiment, a structure comprises a substrate. The structure further comprises a tunnel oxide layer, where the tunnel oxide layer is situated on the substrate. The structure further comprises a floating gate situated on the tunnel oxide layer, where the floating gate comprises nitrogen. The floating gate may further comprise polysilicon and may be situated in a floating gate flash memory cell, for example. The nitrogen may suppress oxide growth at first and second end regions of the tunnel oxide layer, for example. The nitrogen may be implanted in the floating gate, for example, at a concentration of between approximately $10^{13}$ atoms per $cm^2$ and approximately $10^{15}$ atoms per $cm^2$. According to this exemplary embodiment, the structure further comprises an ONO stack situated over the floating gate. The structure may further comprise a control gate situated over the ONO stack.

14 Claims, 3 Drawing Sheets

STRUCTURE AND METHOD FOR SUPPRESSING OXIDE ENCROACHMENT IN A FLOATING GATE MEMORY CELL

TECHNICAL FIELD

The present invention is generally related to the field of semiconductor devices. More particularly, the present invention is related to memory cells in semiconductor devices.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash memory devices are similar to EEPROM devices in that memory cells can be programmed and erased electrically. However, flash memory devices enable the erasing of all memory cells in the device using a single current pulse.

Product development efforts in flash memory devices have focused on increasing the programming speed, lowering programming and reading voltages, increasing data retention time, reducing cell erasure times, reducing cell dimensions, and optimizing dielectric materials used in memory cells. In fabrication of flash memory cells utilizing floating gate flash memory technology, one important dielectric material is a thin gate oxide layer (also referred to as a tunnel oxide layer), which is situated between a floating gate and a silicon substrate. For optimal flash memory cell performance, it is desirable to have a thin tunnel oxide layer that also has a substantially uniform thickness between the floating gate and the silicon substrate.

During fabrication of a floating gate memory cell, such as a floating gate flash memory cell, a tunnel oxide layer is formed on a silicon substrate. A stacked gate structure comprising a floating gate, an Oxide-Nitride-Oxide (ONO) stack, and a control gate (also referred to as a word line) is then formed on the tunnel oxide layer. The stacked gate structure is then patterned by, for example, masking and etching the stacked gate structure. During etching of the stacked gate structure, the underlying tunnel oxide layer is also etched, resulting in exposed sides of the tunnel oxide layer. Consequently, during subsequent thermal oxidation steps utilized in the formation of the floating gate flash memory cell, oxygen can diffuse into end regions of the tunnel oxide layer and cause the end regions to grow thicker. The thickening of the end regions of the tunnel oxide layer discussed above is herein referred to as "lateral oxide encroachment." The thickening of the end regions of the tunnel oxide layer is also colloquially referred to as a "bird's beak" profile.

As a result of thickening of the end regions of the tunnel oxide layer discussed above, performance of the floating gate memory cell can be undesirably diminished. For example, the thicker end regions of the tunnel oxide layer can decrease floating gate erase uniformity and floating gate memory cell reliability by inhibiting erase current and causing the erase current to be concentrated through thinner portions of the tunnel oxide layer. Furthermore, if the control gate width is sufficiently narrow, e.g. at a control gate width of approximately 0.25 microns, the "bird's beak" profiles that form at end regions of the tunnel oxide layer can join in the middle of the tunnel oxide layer, causing an undesirable overall increase of tunnel oxide layer thickness. The overall increase in tunnel oxide layer thickness can reduce performance and reliability of the floating gate memory cell.

In one attempt to reduce the "bird's beak" profile discussed above, semiconductor memory manufacturers have reduced the thermal budget for oxide deposition. However, this attempted solution to the "bird's beak" formation problem can result in an insufficient amount of oxide being deposited to adequately protect the silicon surface of the wafer. Additionally, the attempted solution discussed above can also result in an oxide of an insufficient quality to adequately protect the wafer's silicon surface.

Thus, there is a need in the art for a floating gate memory cell having increased performance and reliability.

SUMMARY

The present invention is directed to structure and method for suppressing oxide encroachment in a floating gate memory cell. The present invention addresses and resolves the need in the art for a floating gate memory cell having increased performance and reliability.

According to one exemplary embodiment, a structure comprises a substrate. The structure further comprises a tunnel oxide layer, where the tunnel oxide layer is situated on the substrate. The structure further comprises a floating gate situated on the tunnel oxide layer, where the floating gate comprises nitrogen. The floating gate may further comprise polysilicon and may be situated in a floating gate flash memory cell, for example. The nitrogen may suppress oxide growth at first and second end regions of the tunnel oxide layer, for example. The nitrogen may be implanted in the floating gate, for example, at a concentration of between approximately $10^{13}$ atoms per $cm^2$ and approximately $10^{15}$ atoms per $cm^2$.

According to this exemplary embodiment, the structure further comprises an ONO stack situated over the floating gate. The structure may further comprise a control gate situated over the ONO stack. Other features and advantages of the present invention will become more readily apparent to those of ordinary skill in the art after reviewing the following detailed description and accompanying drawings.

DETAILED DESCRIPTION OF THE INVENTION

The present invention is directed to structure and method for suppressing tunnel oxide growth in a floating gate memory cell. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves an innovative process for suppressing oxide growth at end regions of a tunnel oxide layer during formation of a floating gate memory cell. As will be discussed in detail below, by suppressing oxide growth at end regions of a tunnel oxide layer during formation of a floating gate memory cell, the present invention's innovative process advantageously achieves a floating gate memory cell having a thin tunnel oxide layer that has a substantially flat top surface even at its sides. As a result, the present invention advantageously achieves a floating gate memory cell having increased performance and reliability. The present invention can be applied to any non-volatile memory, including flash memory.

Figure 1:
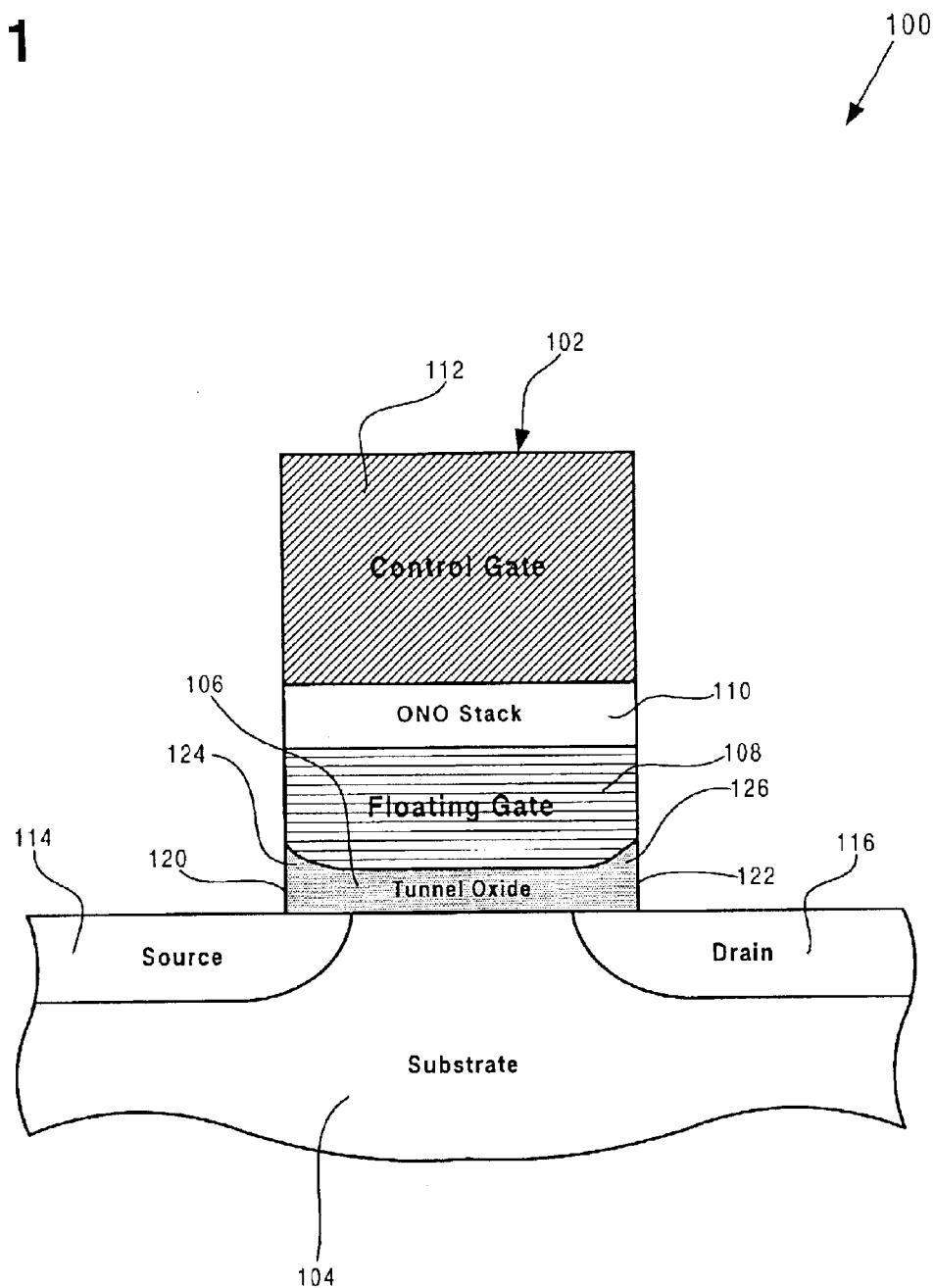
FIG. 1 illustrates a cross-sectional view of a structure including a conventional exemplary floating gate memory cell.

FIG. 1 shows a cross-sectional view of an exemplary structure including a conventional exemplary floating gate memory cell. Structure 100 includes conventional floating gate memory cell 102, which is situated on substrate 104. Conventional floating gate memory cell 102 includes tunnel oxide layer 106, floating gate 108, ONO stack 110, control gate 112, source 114, and drain 116.

As shown in FIG. 1, tunnel oxide layer 106 is situated on substrate 104, which can be a silicon substrate. Tunnel oxide layer 106 can comprise thermally grown tunnel oxide and can have an initial thickness of between approximately 70.0 Angstroms and approximately 120.0 Angstroms. Also shown in FIG. 1, floating gate 108 is situated on tunnel oxide 106 and can comprise polycrystalline silicon (also referred to as polysilicon), which can be deposited in a low pressure chemical vapor deposition (LPCVD) process.

Further shown in FIG. 1, ONO stack 110 is situated on floating gate 108. ONO stack 110 is a three-layer structure, which comprise a bottom layer of silicon oxide, a middle layer of silicon nitride, and a top layer of silicon oxide, which can be sequentially deposited by LPVCD process or thermally grown. Also shown in FIG. 1, control gate 112 is situated on ONO stack 110. Control gate 112 can comprise polysilicon, which can be grown in an LPCVD process.

Floating gate 108, ONO stack 110, and control gate 112 can be formed by patterning a gate stack comprising a first polysilicon layer, a three-layer ONO stack, and a second polysilicon layer, respectively, in a subsequent patterning step in a manner known in the art. Tunnel oxide layer 106 can also be formed in the patterning step discussed above. Also shown in FIG. 1, source 114 and drain 116 are situated in substrate 104 and formed in a manner known in the art.

After formation of tunnel oxide layer 106, end regions 120 and 122 of tunnel oxide 106 are exposed. As a result, during subsequent thermal processing steps, such as oxidation and annealing steps, utilized in forming conventional floating gate memory cell 102, oxygen can diffuse into end regions 120 and 122 and cause end regions 120 and 122 to grow thicker, forming oxide encroachment areas 124 and 126, respectively. Oxide encroachment areas 124 and 126, also known as "bird's beak" profiles, can undesirably increase the thickness of end regions 120 and 122 of tunnel oxide 106 to between approximately 90.0 Angstroms and approximately 140.0 Angstroms. Furthermore, as the width of control gate 112 is scaled down to approximately 0.25 microns in a current generation of floating gate memory devices, oxide encroachment areas 124 and 126 can laterally increase to a point where oxide encroachment areas 124 and 126 meet at the approximate center of tunnel oxide layer 106. As a result, the overall thickness of tunnel oxide 106 undesirably increases, which reduces performance and reliability of conventional floating gate memory cell 102.

Figure 2:
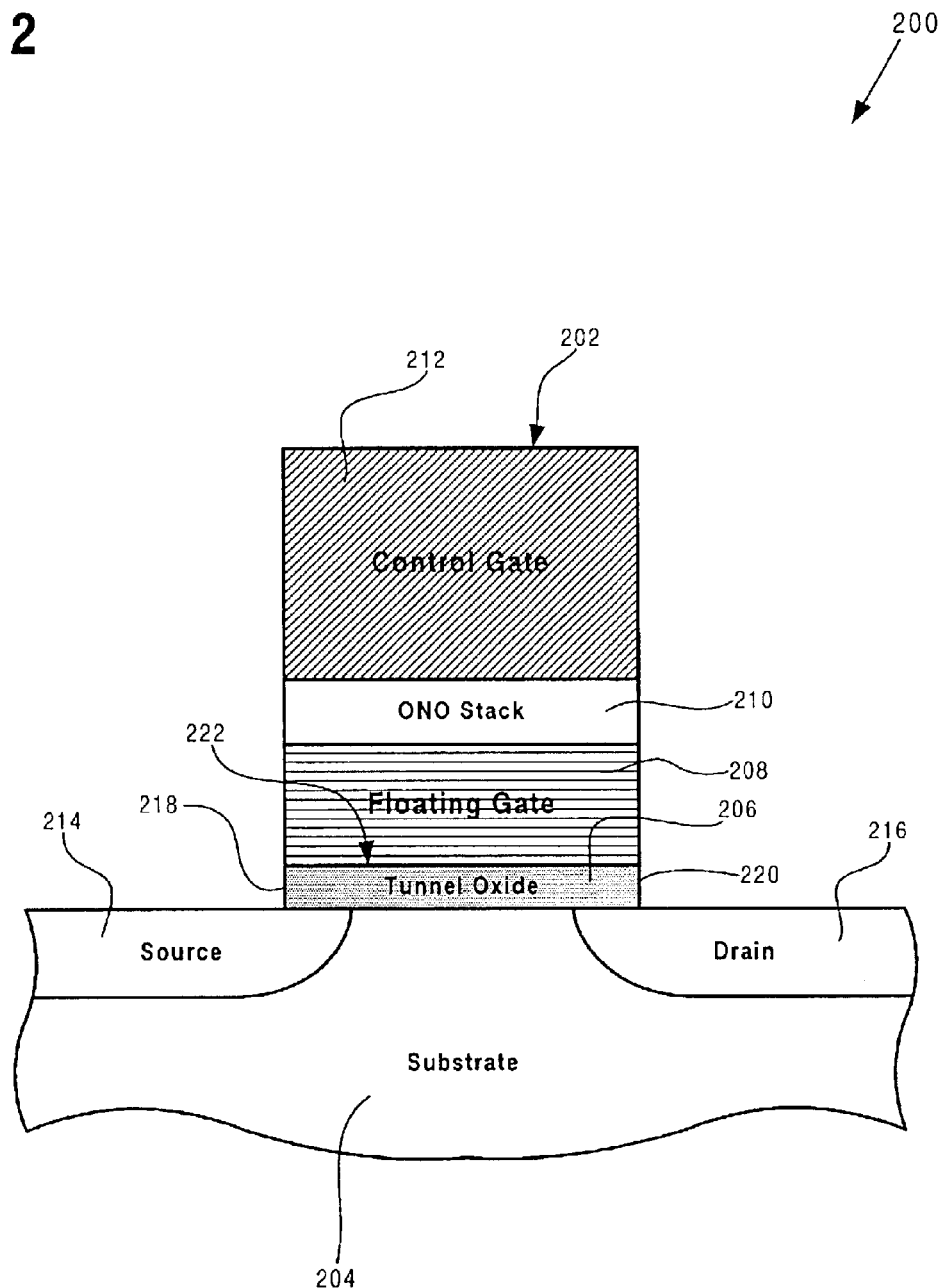
FIG. 2 illustrates a cross-sectional view of a structure including an exemplary floating gate memory cell, in accordance with one embodiment of the present invention.

FIG. 2 shows a cross-sectional view of an exemplary structure including an exemplary floating gate memory cell in accordance with one embodiment of the present invention. Structure 200 includes floating gate memory cell 202, which is situated on substrate 204. Floating gate memory cell 202 includes tunnel oxide layer 206, floating gate 208, ONO stack 210, control gate 212, source 214, and drain 216.

As shown in FIG. 2, tunnel oxide 206 is situated on substrate 204, which can comprise a semiconductor such as silicon. Tunnel oxide layer 206 can comprise tunnel oxide, which is thermally grown on substrate 204. Tunnel oxide layer 206 can have a thickness of between approximately 70.0 Angstroms and approximately 120.0 Angstroms. Tunnel oxide layer 206 can be formed by, for example, etching a thermally grown layer of tunnel oxide in a subsequent patterning step. Also shown in FIG. 2, floating gate 208 is situated on tunnel oxide layer 206. Floating gate 208 can comprise polysilicon, which can, for example, be deposited in an LPCVD process and can have a thickness of between approximately 400.0 Angstroms and approximately 1000.0 Angstroms.

In the present embodiment, after a layer of polysilicon has been deposited over a layer of tunnel oxide on substrate 204, nitrogen is implanted into the layer of polysilicon utilizing a nitrogen implant. In the present embodiment, the nitrogen implant can have a nitrogen concentration of between approximately $10^{13}$ atoms/cm$^2$ and approximately $10^{15}$ atoms/cm$^2$. In the present embodiment, the nitrogen can be implanted at a low implant power of between approximately 5.0 keV and approximately 50.0 keV. Although nitrogen is introduced into the layer of polysilicon by implantation in the present embodiment, nitrogen can also be introduced into the layer of polysilicon utilizing other methods or processes in other embodiments. The layer of polysilicon, which has been implanted with nitrogen, can be patterned in a subsequent patterning step to form floating gate 208.

Thus, the present invention achieves a floating gate, i.e. floating gate 208, comprising nitrogen, which advantageously suppresses oxidation of polysilicon in floating gate 208 and advantageously suppresses oxide growth at end regions 218 and 220 of tunnel oxide layer 206. Thus, for example, the present invention can achieve a reduction in oxide encroachment areas 124 and 126 in tunnel oxide layer 106 in conventional floating gate memory cell 102 in FIG. 1. The present invention can advantageously achieve a reduction in oxide growth or oxide encroachment, such as oxide encroachment areas 124 and 126, at end regions of a tunnel oxide layer, such as end regions 120 and 122 of tunnel oxide layer 106, by a factor of between approximately 3 and approximately 10, for example. Thus, if an oxide encroachment area in a conventional tunnel oxide layer has a height of 20.0 Angstroms, for example, the present invention could reduce the height of the oxide encroachment area to between approximately 2.0 Angstroms and approximately 6.0 Angstroms. Thus, by implanting nitrogen in floating gate 208, the present invention advantageously achieves a tunnel oxide layer, i.e. tunnel oxide layer 206, having a substantially flat top surface 222, which can advantageously remain substantially flat after subsequent thermal processing steps, such as oxidation and annealing steps. As a result, the present invention advantageously achieves a floating gate memory cell having increased performance and reliability.

Also shown in FIG. 2, ONO stack 210 is situated over floating gate 208. Similar to ONO stack 110 discussed above, ONO stack 210 is a three-layer structure that comprises a bottom layer of silicon oxide, a middle layer of silicon nitride, and a top layer of silicon oxide, which can be sequentially deposited by LPCVD process or thermally grown. The middle layer of silicon nitride and the bottom and top layers of silicon oxide can each have a thickness of between approximately 40.0 Angstroms and approximately 100.0 Angstroms. ONO stack 210 can be formed in a manner similar to ONO stack 110 discussed above.

Figure 3:
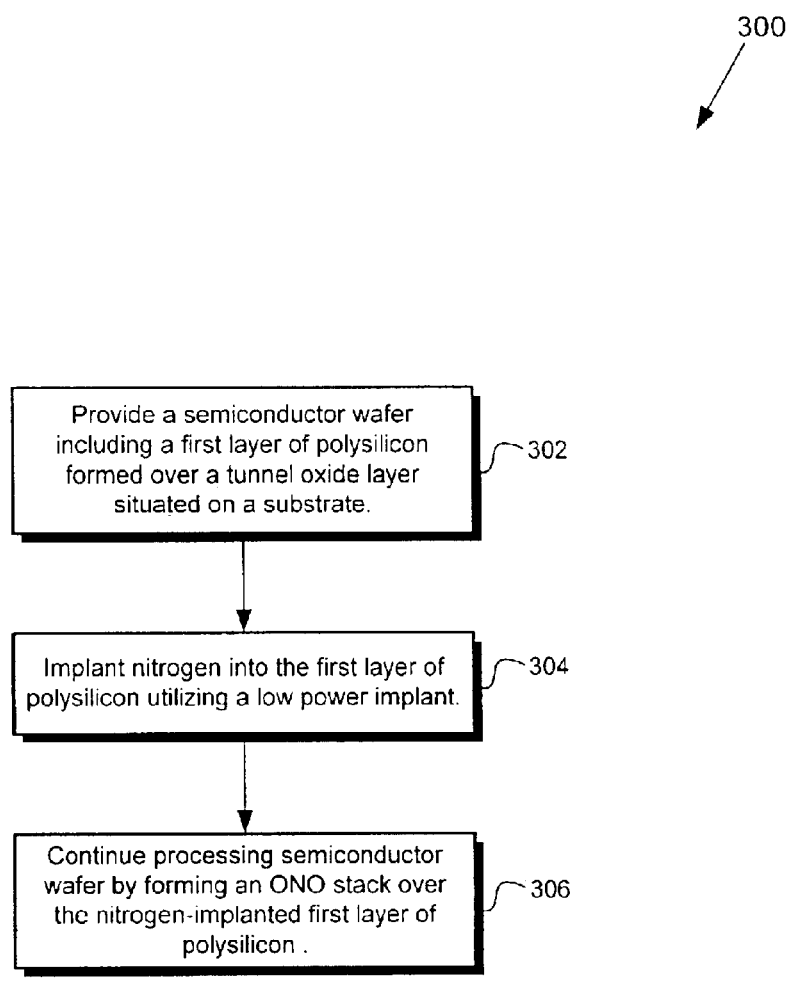
FIG. 3 is a flow chart corresponding to exemplary method steps according to one embodiment of the present invention.

Further shown in FIG. 2, control gate 212 is situated over ONO stack 210. Similar to control gate 112 in FIG. 1, control gate 212 can comprise polysilicon and can have a thickness of between approximately 1500.0 Angstroms and approximately 2000.0 Angstroms. Control gate 212 can be formed by growing a layer of polysilicon over an ONO stack utilizing an LPCVD process. The layer of polysilicon can be patterned in a subsequent patterning step to form control gate 212. Also shown in FIG. 2, source 214 and drain 216 are situated in substrate 204 and can be formed in a subsequent processing step in a manner known in the art:

FIG. 3 shows a flow chart illustrating an exemplary method according to an embodiment of the present invention. Certain details and features have been left out of flow chart 300 that are apparent to a person of ordinary skill in the art. For example, a step may consist of one or more substeps or may involve specialized equipment or materials, as known in the art.

At step 302, a semiconductor wafer is provided, which includes a layer of polysilicon that has been deposited over a layer of thermally grown tunnel oxide layer situated on a substrate, such as substrate 204 in FIG. 2. As discussed above, the layer of polysilicon can be deposited over the tunnel oxide layer in an LPCVD process. At step 304, nitrogen is implanted into the layer of polysilicon. The nitrogen can be implanted into the layer of polysilicon at a concentration of between approximately $10^{13}$ atoms/cm$^2$ and approximately $10^{15}$ atoms/cm$^2$ and can be implanted at a low implant power of between approximately 5.0 keV and approximately 50.0 keV. The nitrogen-implanted layer of polysilicon can be patterned in a subsequent patterning step to form a floating gate, such as floating gate 208 in FIG. 2. At step 306, processing of the semiconductor wafer continues by sequentially depositing or growing a bottom silicon oxide layer, a nitride layer, and a top silicon oxide layer to form a three-layer ONO layer, which can be patterned in a subsequent patterning step to form an ONO stack, such as ONO stack 210 in FIG. 2. Control gate 112 can be formed by depositing a layer of polysilicon over the three-layer ONO layer and patterning the layer of polysilicon in a subsequent patterning step as discussed above.

Thus, as discussed above, by implanting nitrogen in a layer of polysilicon situated over a tunnel oxide layer on a substrate, the present invention advantageously achieves suppressed oxide growth that can occur in end regions of the tunnel oxide layer during subsequent thermal processing steps, such as oxidation and anneal steps, utilized in fabricating a floating gate memory cell. As a result, as discussed above, the present invention achieves a floating gate memory cell including a thin tunnel oxide layer having a substantially flat top surface, which advantageously increases performance and reliability of the floating gate memory cell.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, structure and method for suppressing oxide encroachment in a floating gate memory cell have been described.

What is claimed is:

1. A structure comprising:

a substrate comprising a semiconductor;

a tunnel oxide layer situated on said substrate;

a floating gate situated on said tunnel oxide layer, said floating gate comprising nitrogen;

an ONO stack situated directly on said floating gate;

wherein said nitrogen suppresses oxide growth at first and second regions of said tunnel oxide layer.

2. The structure of claim 1 wherein said nitrogen is implanted in said floating gate.

3. The structure of claim 2 wherein said nitrogen is implanted in said floating gate at a concentration of between approximately $10^{13}$ atoms per cm$^2$ and approximately $10^{15}$ atoms per cm$^2$.

4. The structure of claim 1, wherein said floating gate further comprises polysilicon.

5. The structure of claim 1 further comprising a control gate situated over said ONO stack.

6. The structure of claim 5, wherein said control gate comprises polysilicon.

7. The structure of claim 1 wherein said floating gate is situated in a flash memory cell.

8. A structure comprising a substrate, a tunnel oxide layer situated on said substrate, a floating gate situated on said tunnel oxide layer, said structure being characterized in that:

said floating gate comprises nitrogen and an ONO stack is situated directly on said floating gate; wherein said nitrogen suppresses oxide growth at first and second regions of said tunnel oxide layer.

9. The structure of claim 8 wherein said nitrogen is implanted in said floating gate.

10. The structure of claim 9 wherein said nitrogen is implanted in said floating gate at a concentration of between approximately $10^{13}$ atoms per cm$^2$ and approximately $10^{15}$ atoms per cm$^2$.

11. The structure of claim 8 wherein said floating gate further comprises polysilicon.

12. The structure of claim 8 further comprising a control gate situated over said ONO stack.

13. The structure of claim 1 wherein said floating gate has a thickness of between approximately 400.0 Angstroms and approximately 1000.0 Angstroms.

14. The structure of claim 8 wherein said floating gate has a thickness of between approximately 400.0 Angstroms and approximately 1000.0 Angstroms.

* * * * *